(12) United States Patent
Sorimachi

(10) Patent No.: US 8,956,887 B2
(45) Date of Patent: Feb. 17, 2015

(54) METHOD FOR MANUFACTURING SEMICONDUCTOR LIGHT-EMITTING ELEMENT

(75) Inventor: Kazuaki Sorimachi, Saitama (JP)

(73) Assignees: Citizen Holdings Co., Ltd., Tokyo (JP); Citizen Electrinocs Co., Ltd., Yamanashi (JP)

( * ) Notice: Subject to any disclaimer, the term of this patent is extended or adjusted under 35 U.S.C. 154(b) by 0 days.

(21) Appl. No.: 14/129,970

(22) PCT Filed: Jun. 28, 2012

(86) PCT No.: PCT/JP2012/066586
§ 371 (c)(1),
(2), (4) Date: Mar. 14, 2014

(87) PCT Pub. No.: WO2013/005646
PCT Pub. Date: Jan. 10, 2013

(65) Prior Publication Data
US 2014/0220714 A1    Aug. 7, 2014

(30) Foreign Application Priority Data

Jul. 1, 2011   (JP) .................. 2011-146988

(51) Int. Cl.
| H01L 21/66 | (2006.01) |
| H01L 21/00 | (2006.01) |
| H01L 33/52 | (2010.01) |
| H01L 33/50 | (2010.01) |
| H01L 25/075 | (2006.01) |

(52) U.S. Cl.
CPC .............. *H01L 33/52* (2013.01); *H01L 33/505* (2013.01); *H01L 22/30* (2013.01); *H01L 25/0753* (2013.01); *H01L 2933/0041* (2013.01)
USPC .................... 438/15; 438/26; 438/29; 438/33

(58) Field of Classification Search
None
See application file for complete search history.

(56) References Cited

U.S. PATENT DOCUMENTS

| 7,344,952 B2 | 3/2008 | Chandra |
| 2007/0262702 A1 | 11/2007 | Fujita et al. |
| 2008/0137106 A1 | 6/2008 | Ono |
| 2011/0297980 A1 | 12/2011 | Sugizaki et al. |

FOREIGN PATENT DOCUMENTS

| JP | 2007-123915 A | 5/2007 |
| JP | 2007-311663 A | 11/2007 |
| JP | 2008-145300 A | 6/2008 |
| JP | 2009-229507 A | 10/2009 |
| JP | 2011-253998 A | 12/2011 |
| WO | 2005/097938 A1 | 10/2005 |

OTHER PUBLICATIONS

International Search Report for PCT/JP2012/066586, Aug. 14, 2012.

*Primary Examiner* — Scott B Geyer

(57) ABSTRACT

The invention is directed to the provision of a method for manufacturing a semiconductor light-emitting element that eliminates the need for preparing a plurality of different fluorescent sheets. The method for manufacturing the semiconductor light-emitting element containing an LED die includes the steps of arranging the LED die on a fluorescent sheet containing a fluorescent substance and adjusting the amount by which the LED die is depressed into the fluorescent sheet so that the semiconductor light-emitting element has a desired color emission.

9 Claims, 5 Drawing Sheets

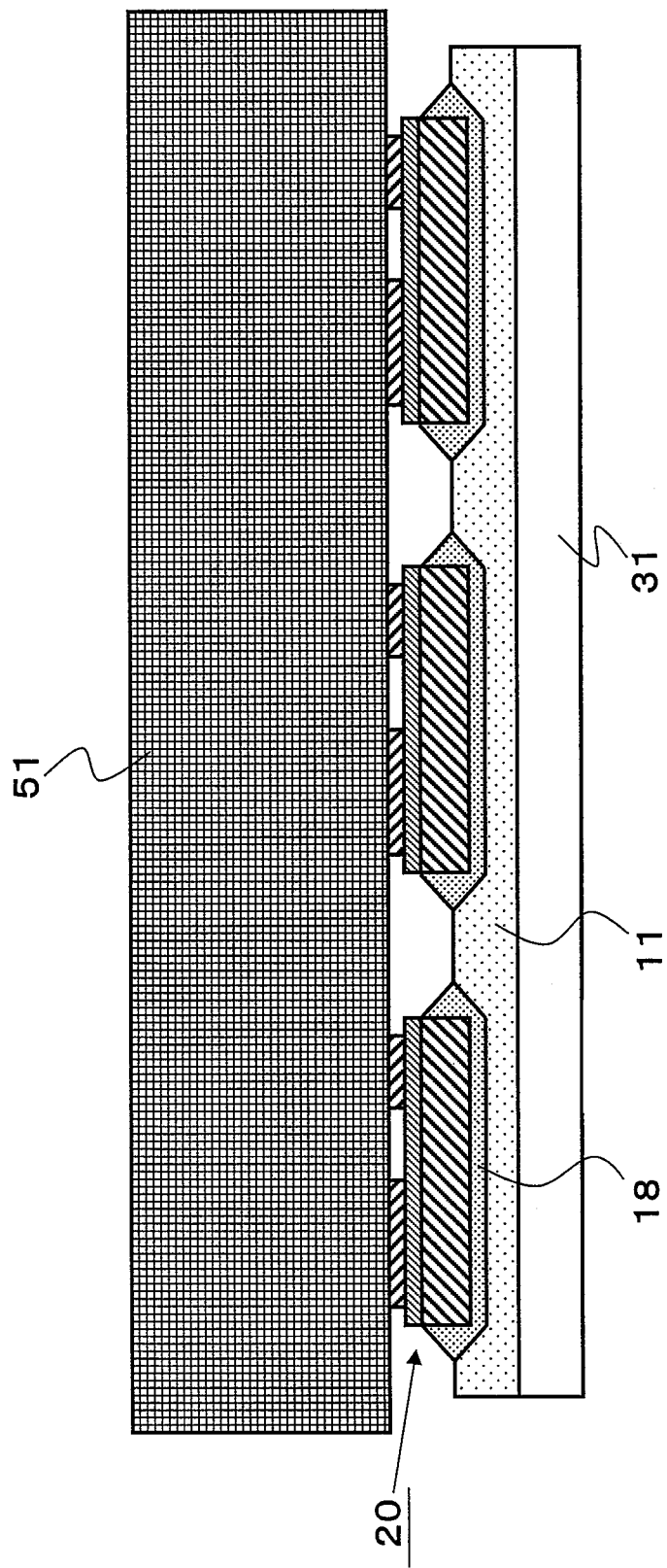

US 8,956,887 B2

METHOD FOR MANUFACTURING SEMICONDUCTOR LIGHT-EMITTING ELEMENT

TECHNICAL FIELD

The present invention relates to a method for manufacturing a semiconductor light-emitting element having a fluorescent layer on an upper surface of a light-emitting diode formed from a die, and more particularly to a method for manufacturing a semiconductor light-emitting element whose color emission is adjusted.

BACKGROUND

In a semiconductor light-emitting element (hereinafter called the LED device unless specifically designated otherwise) containing a fluorescent substance and a light-emitting diode formed from a die (hereinafter called the LED die unless specifically designated otherwise), the LED die emits blue or near ultraviolet light, and white light is produced, in many cases, by utilizing the wavelength conversion effect of the fluorescent layer. The chromaticity of the white light changes due to various factors such as the amount of the fluorescent substance contained and the peak wavelength of the light emission.

Since variations in color emission from one LED device to another are undesirable, each LED device may be adjusted for chromaticity. For example, FIG. 5 in patent document 1 presents a flowchart for chromaticity adjustment, and FIG. 4 illustrates a laminating process including a chromaticity adjusting step. In FIG. 4 of patent document 1, first an array of blue light-emitting diodes 12 (LED dies) are mounted on a substrate 24, and a fluorescent substance-containing synthetic film 51 (fluorescent sheet) is placed over the array and tested for color emission. If the emitted color does not fall within a predetermined range of chromaticity, the test is repeated by changing the synthetic film 51. If the emitted color falls within the predetermined range of chromaticity, then the synthetic film 51 is permanently laminated onto the blue light-emitting diodes 12.

PRIOR ART DOCUMENTS

Patent Documents

Patent document 1: Japanese Unexamined Patent Publication No. 2007-123915 (FIGS. 4 and 5)

SUMMARY

Problems to be Solved by the Invention

The semiconductor light-emitting element manufacturing method disclosed in patent document 1 involves the problem that a plurality of fluorescent sheets having different characteristics have to be prepared in advance. The method has had the further problem that, when using a fluorescent substance sensitive to the peak wavelength of the light emission of the blue light-emitting diodes 12, the peak wavelength characteristics of the blue light-emitting diodes 12 to be mounted on the single substrate 24 have to be made uniform.

It is an object of the present invention to provide a method for manufacturing a semiconductor light-emitting element wherein provisions are made to be able to solve the above problems.

It is another object of the present invention to provide a method for manufacturing a semiconductor light-emitting element that eliminates the need for preparing a plurality of different fluorescent sheets.

It is another object of the present invention to provide a method for manufacturing a semiconductor light-emitting element that can adjust chromaticity without having to make the peak wavelengths uniform.

It is another object of the present invention to provide a method for manufacturing a semiconductor light-emitting element that eliminates the need for preparing a plurality of different fluorescent sheets and that can adjust chromaticity without having to make the peak wavelengths uniform.

Means for Solving the Problems

There is provided a method for manufacturing a semiconductor light-emitting element including the steps of arranging an LED die on a fluorescent sheet containing a fluorescent substance, and adjusting an amount by which the LED die is depressed into the fluorescent sheet so that the semiconductor light-emitting element has a desired color emission.

Preferably, the method for manufacturing the semiconductor light-emitting element further includes the step of preparing a plurality of LED dies having substantially identical emission wavelength distributions, wherein the plurality of LED dies having substantially identical emission wavelength distributions are arranged side by side on the fluorescent sheet, and the plurality of LED dies having substantially identical emission wavelength distributions are depressed into the fluorescent sheet by applying pressure simultaneously to the plurality of LED dies by using a head.

Preferably, in the method for manufacturing the semiconductor light-emitting element, some of the plurality of LED dies are caused to emit light, pressure is applied to some of the plurality of LED dies while measuring the color of light emitted from some of the plurality of LED dies caused to emit light, the amount of depression is determined so that the color of light emitted from some of the plurality of LED dies caused to emit light matches the desired color emission, and other LED dies which is other than some of the plurality of LED dies caused to emit light among the plurality of LED dies are depressed simultaneously into the fluorescent sheet by the determined amount of depression by applying pressure simultaneously to the other LED dies.

Preferably, in the method for manufacturing the semiconductor light-emitting element, the head is capable of applying pressure and heat.

Preferably, in the method for manufacturing the semiconductor light-emitting element, the fluorescent sheet is laminated to a transparent stage, the LED die is depressed into the fluorescent sheet while causing the LED die to emit light, the color of emitted light is measured through the transparent stage, and the amount of depression is determined so that the color of the emitted light matches the desired color emission.

Preferably, the method for manufacturing the semiconductor light-emitting element further includes the step of applying an adhesive material between the fluorescent sheet and the LED die before depressing the LED die into the fluorescent sheet.

Preferably, the method for manufacturing the semiconductor light-emitting element further includes the step of molding a reflective resin so as to surround the LED die after adjusting the amount of depression.

Preferably, the method for manufacturing the semiconductor light-emitting element further includes the steps of after the molding step, cutting the fluorescent sheet together the reflective resin to separate each individual semiconductor light-emitting element, and mounting the separated semiconductor light-emitting element on a surface mount carrier tape.

Effect

According to the semiconductor light-emitting element manufacturing method, the LED die is depressed into the fluorescent sheet placed on the transparent stage, and the color of emission is adjusted by utilizing the property that the chromaticity changes depending on the amount of depression; this eliminates the need for preparing a plurality of different fluorescent sheets.

In the semiconductor light-emitting element manufacturing method, when adjusting the chromaticity by suitably adjusting the amount of depression while measuring the chromaticity for each individual LED device, only one fluorescent sheet need be provided for chromaticity adjustment for each individual LED device, and there is no need to make the emission peak wavelengths, etc. uniform. That is, the semiconductor light-emitting element manufacturing method eliminates the need for preparing a plurality of different fluorescent sheets, and can adjust the chromaticity without having to make the peak wavelengths uniform.

BRIEF DESCRIPTION OF THE DRAWINGS

FIG. 1(*b*) is a front view of the LED device.

FIG. 1(*c*) is a bottom view of the LED device.

FIG. 3(*b*) is a diagram (part 2) for explaining the fabrication process of the LED device shown in FIG. 1.

FIG. 3(*c*) is a diagram (part 3) for explaining the fabrication process of the LED device shown in FIG. 1.

FIG. 3(*d*) is a diagram (part 4) for explaining the fabrication process of the LED device shown in FIG. 1.

FIG. 4(*b*) is a diagram (part 6) for explaining the fabrication process of the LED device shown in FIG. 1.

FIG. 4(*c*) is a diagram (part 7) for explaining the fabrication process of the LED device shown in FIG. 1.

FIG. 4(*d*) is a diagram (part 8) for explaining the fabrication process of the LED device shown in FIG. 1.

FIG. 5 is a diagram for explaining an alternative fabrication process.

DESCRIPTION

Figure 1A:
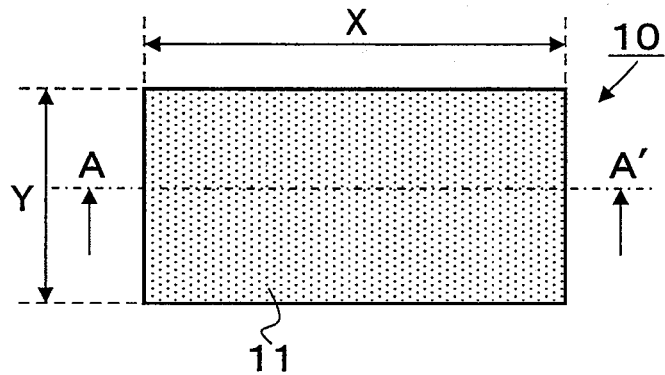
FIG. 1(*a*) is a top plan view of an LED device.

A method for manufacturing a semiconductor light-emitting element will be described below with reference to the drawings. It will, however, be noted that the technical scope of the present invention is not limited by any particular embodiment described herein but extends to the inventions described in the appended claims and their equivalents. Further, in the description of the drawings, the same or corresponding component elements are designated by the same reference numerals, and the description of such component elements, once given, will not be repeated thereafter. It will also be noted that the scale to which each component element is drawn is changed as needed for illustrative purposes.

Figure 1B:
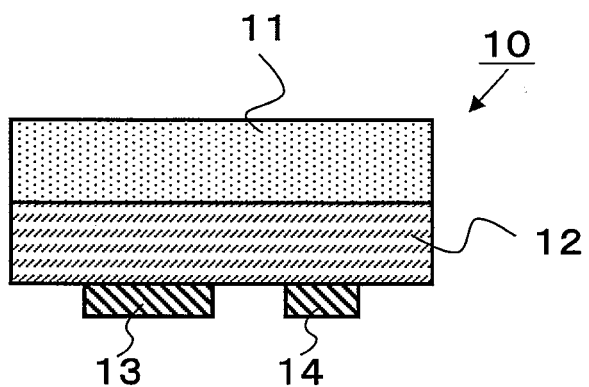
Figure 1C:
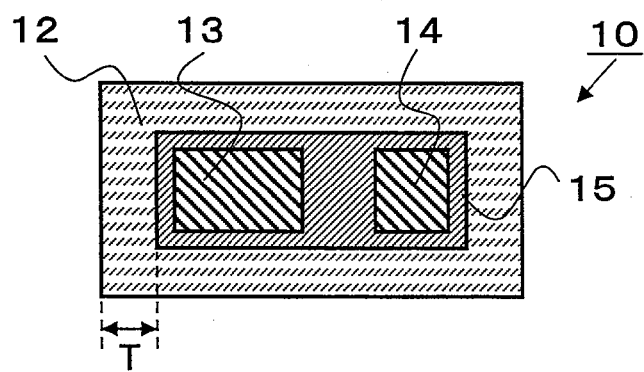

FIG. 1 is a diagram showing the external appearance of an LED device 10. FIG. 1(*a*) is a top plan view of the LED device 10, FIG. 1(*b*) is a front view of the LED device 10, and FIG. 1(*c*) is a bottom view of the LED device 10.

When the LED device 10 is observed from the top, only a rectangular fluorescent sheet 11 is seen (see FIG. 1(*a*)). When the LED device 10 is observed from the front, a white reflective layer 12 formed under the fluorescent sheet 11 and device electrodes 13 and 14 formed on the underside of the white reflective layer 12 are seen (see FIG. 1(*b*)). When the LED device 10 is observed from the bottom, a semiconductor layer 15 surrounded with the white reflective layer 12 and the device electrodes 13 and 14 located inside the semiconductor layer 15 are seen (see FIG. 1(*c*)).

Figure 2:
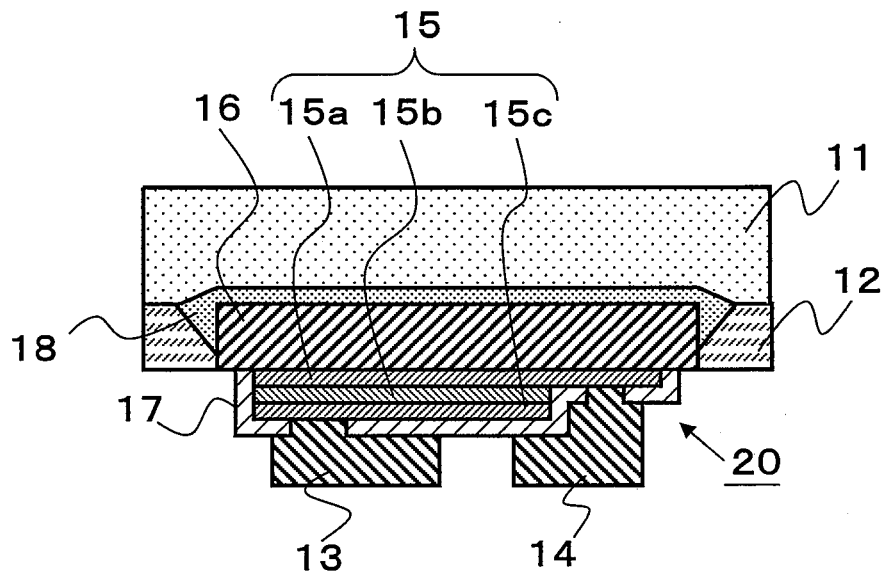
FIG. 2 is a cross-sectional view of the LED device taken along line AA' in FIG. 1.

FIG. 2 is a cross-sectional view taken along line AA' in FIG. 1.

As shown in FIG. 2, the LED device 10 comprises an LED die 20, the fluorescent sheet 11 placed over the upper surface of the LED die 20 as viewed in the figure, the white reflective layer 12 formed around the edges of the LED die 20, and an adhesive member 18 applied so as to cover the edges as well as the upper surface of the LED die 20 as viewed in the figure. The portion of the fluorescent sheet 11 that lies directly above the LED die 20 is recessed.

The LED die 20 comprises a sapphire substrate 16, a semiconductor layer 15, a protective film 17, and device electrodes 13 and 14. The LED die 20 is sliced from a wafer which is used as the transparent insulating substrate of sapphire, and the device electrodes 13 and 14 are formed on the completed wafer.

The sapphire substrate 16 has a thickness of about 70 to 150 μm, and defines the outer plan shape of the LED die 20. The semiconductor layer 15 formed on the underside of the sapphire substrate 16 has a multilayered structure in which a light-emitting layer 15*b* and an n-type semiconductor layer 15*a* are formed one on top of the other on a p-type semiconductor layer 15*c*.

The n-type semiconductor layer 15*a* comprises an n-type GaN layer and a buffer layer for adjusting the lattice constant, and has a thickness of about 5 μm. The light-emitting layer 15*b* has a thickness of about 100 nm, and emits blue light. The p-type semiconductor layer 15*c* has a multilayered structure comprising a p-type GaN layer and metallic layers formed from a plurality of metals, and has a thickness of about 1 μm. The metallic layers contained in the p-type semiconductor layer 15*c* includes a reflective layer by which rays of light emitted downward from the light-emitting layer 15*b* are reflected upward as viewed in the figure.

The protective film 17 is deposited so as to cover the semiconductor layer 15, and is formed with openings to expose a portion of the p-type semiconductor layer 15*c* and a portion of the n-type semiconductor layer 15*a*. The p-type semiconductor layer 15*c* and the n-type semiconductor layer 15*a* are connected to the device electrodes 13 and 14, respectively, through the respective openings. The device electrodes 13 and 14 are plated bumps formed by copper plating, and each is 10 to 30 μm in thickness and has a tin layer on its surface.

The device electrodes 13 and 14 provide the anode and cathode of the LED device 10, and serve as connecting electrodes for connecting to a mother substrate. The mother substrate is a substrate on which the LED device 10 is mounted along with other electronic components such as resistors and capacitors. Since the exposed portion of the n-type semiconductor layer 15*a* is small, the device electrode 14 is formed so as to partially overlap the p-type semiconductor layer 15*c* by interposing the protective film 17 therebetween.

The fluorescent sheet 11 is formed by mixing a fluorescent substance into a silicone resin and kneading the mixture into the shape of a sheet, and has a thickness of about 100 μm. The fluorescent substance contained in the fluorescent sheet 11 converts the wavelength of a portion of the blue light emitted from the LED die 20, and the light whose wavelength has been converted by the fluorescent sheet 11 is mixed with the remaining portion of the blue light to produce the white light emission from the LED device 10.

The white reflective layer 12 is formed by mixing reflective fine particles such as titanium oxide into a silicone resin and thermosetting the mixture. The adhesive member 18 is formed by applying a thermosetting silicone adhesive material to a thickness of about 10 μm.

The reflective fine particles contained in the white reflective layer 12 and the metallic reflective layer contained in the p-type semiconductor layer 15c serve to reflect rays of light emitted downward and sideward from the light-emitting layer 15b as viewed in the figure and redirect them upward of the LED device 10 as viewed in the figure.

In the LED device 10 shown in FIGS. 1 and 2, the bottom face of the LED die 20 measures 1.0 mm×0.5 mm, the thickness T of the white reflective layer 12 is 0.2 mm, and the size (X×Y) of the LED device 10 is 1.4 mm×0.9 mm, thus making the overall size easy to handle by a surface mounter. The above dimensions are only examples, and are not limited to the above particular dimensions.

FIGS. 3 and 4 are diagrams for explaining a fabrication process of the LED device 10.

Figure 3A:
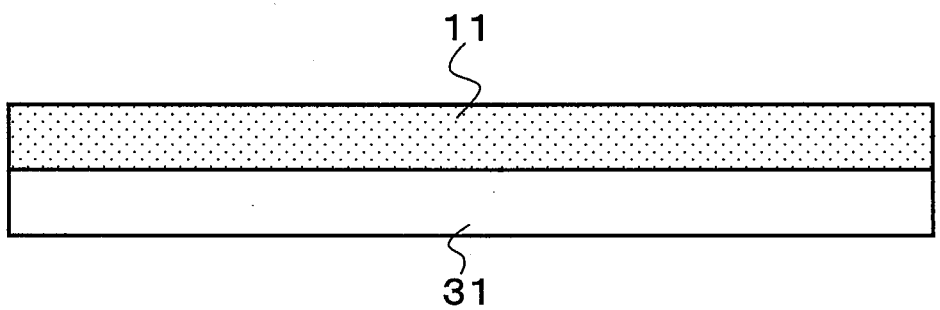
FIG. 3(*a*) is a diagram (part 1) for explaining a fabrication process of the LED device shown in FIG. 1.

First, the fluorescent sheet 11 containing the fluorescent substance is laminated onto a transparent stage 31 (see FIG. 3(a)). It is preferable to use glass as the transparent stage 31. The fluorescent sheet 11, which is thin and soft, is handled with both surfaces thereof protected by a release agent (also called a separator, not shown). In this step, the fluorescent sheet 11 with the release agent applied thereto is laminated onto the transparent stage 31, and the release agent on the upper surface is removed, making it easier to separate the fluorescent sheet 11 from the transparent stage 31 at a later time.

Figure 3B:
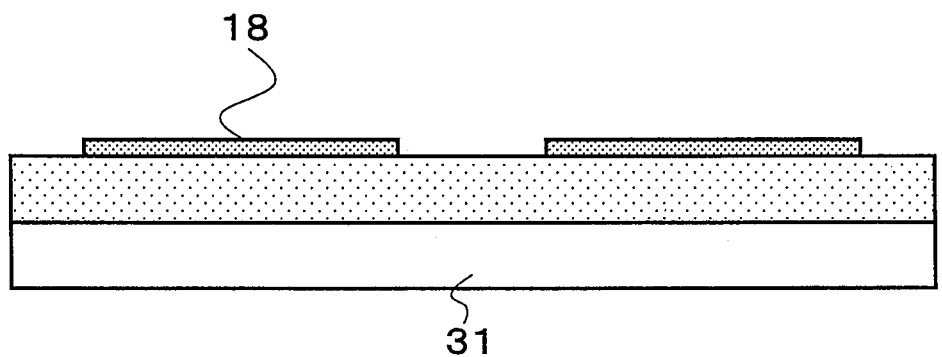

Next, the adhesive member 18 is applied over the portions where the LED dies 20 are to be mounted (see FIG. 3(b)). The adhesive member 18 is applied by screen printing. If the fluorescent sheet 11 itself has an adhesive surface, the adhesive member 18 may be omitted. The fluorescent sheet 11 is large enough that a large number of LED dies 20 can be mounted thereon, but in FIGS. 3 and 4, only two LED dies 20 are shown as being mounted thereon for illustrative purposes.

Figure 3C:
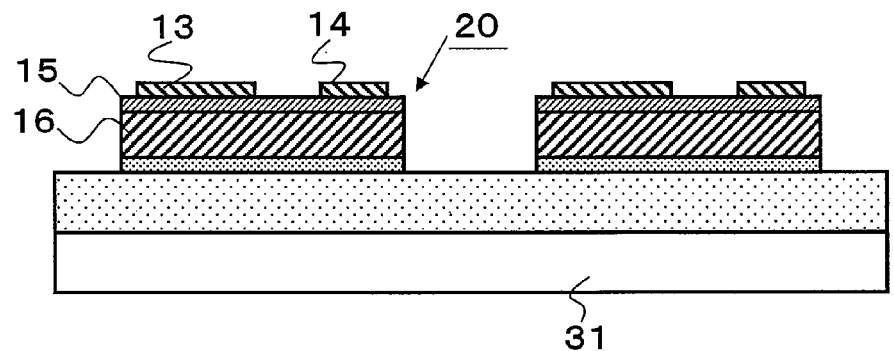

Next, the LED dies 20 are mounted on the fluorescent sheet 11 (see FIG. 3(c)). Each LED die 20 is placed with its sapphire substrate side contacting the fluorescent sheet 11. The LED dies 20 are placed one by one on the fluorescent sheet 11 by a picker (or a sorter). Alternatively, the plurality of LED dies 20 may be first placed on some other suitable adhesive sheet (not shown) which may then be laminated (transferred) to the fluorescent sheet 11.

Figure 3D:
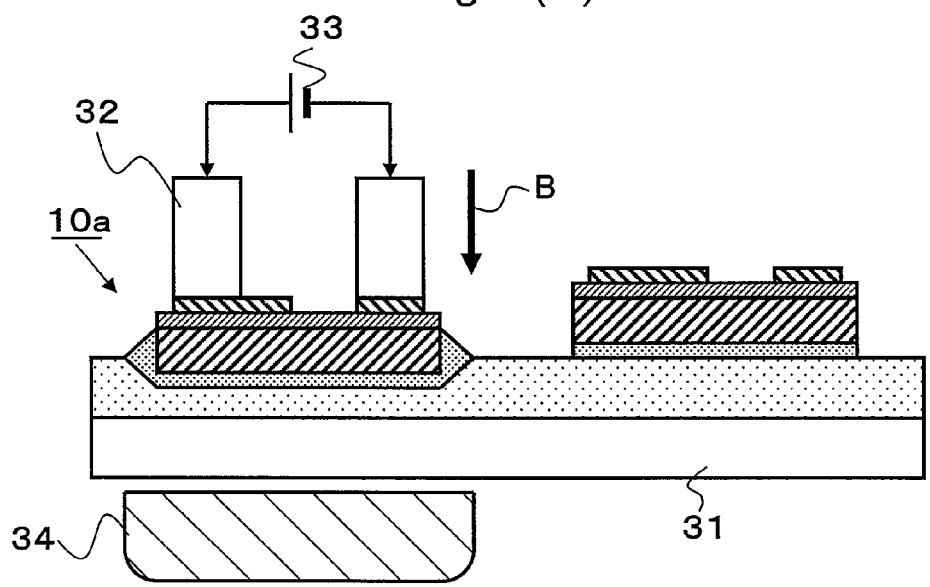

Next, the amount of depression is adjusted to adjust the color emission of the LED device 10a so that the desired color emission can be achieved (see FIG. 3(d)). The suffix "a" in the numeral 10a used to designate the LED device signifies that the LED device 10 is partway through the fabrication process.

To adjust the amount of depression, first a current is applied from a power supply 33 via measuring cylinders 32 to the LED die 20, causing the LED die 20 to emit light. Then, while causing the LED die 20 to emit light, the LED die 20 is depressed (in the direction of arrow B in the figure) into the fluorescent sheet 11 by means of the measuring cylinders 32. In this condition, the color of light emitted from the LED device 10a and passed through the transparent stage 31 is measured by a light detector 34, and the amount of depression effected by the measuring cylinders 32 is adjusted so that the desired color emission can be achieved.

The desired color emission is, for example, 6500 K (Kelvin) for daylight, 5000 K for daylight white light, 4000 to 4500 K for white light, 3500 K for warm white light, and 3000 K or lower for incandescent light. The amount of depression is in the range of 0 to 20 μm. It is preferable that the amount of depression to be adjusted is determined in advance in accordance with the difference between the chromaticity coordinates of the color of emitted light measured and the target chromaticity coordinates predefined in a chromaticity coordinate (X, Y) system. For example, the chromaticity coordinates of 5000 K can be expressed as (0.345, 0.352). In this case, the chromaticity coordinates are shifted by about 10/1000 by adjusting the amount of depression.

When energized, the LED die 20 generates heat whose temperature can exceed 100° C. by several tens of degrees C. The fluorescent sheet 11 softens due to the heat of the LED die 20. When the pressing force of the measuring cylinders 32 is increased, the LED die 20 is depressed deeper into the fluorescent sheet 11. When the LED die 20 is depressed deeper into the fluorescent sheet 11, the fluorescent sheet thickness in effect decreases, causing the chromaticity to change in the blue direction. For example, if the emitted light color measured by the light detector 34 is on the yellowish side compared with the desired color emission, the pressing force of the measuring cylinders 32 is increased to adjust the color toward the blue direction. When the desired color emission is reached, the fluorescent sheet 11 is cured together with the adhesive member 18 by the heat of the LED die 20.

The fluorescent sheet 11 is formed from silicon with incomplete crosslinking, and softens when heated to about 80° C.; the crosslinking begins to proceed at about 100° C., and the sheet cures at 150° C. In view of this, first the color emission is adjusted while causing the fluorescent sheet 11 to soften by the heat of the energized LED die 20. After that, by continuing to energize the LED die 20, the fluorescent sheet 11 and the adhesive member 18 are cured. Here, the fluorescent sheet 11 and the adhesive member 18 need only be tentatively cured. The tentative curing means that the crosslinking is stopped partway through the process. Permanent curing to complete the crosslinking is performed in a subsequent step. When curing the fluorescent sheet 11 and the adhesive member 18, the current applied to the LED die 20 may be increased.

Figure 4A:
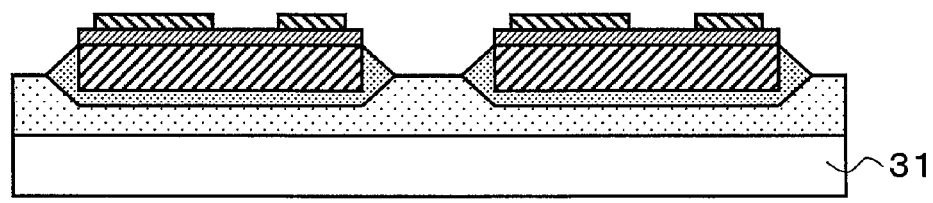
FIG. 4(*a*) is a diagram (part 5) for explaining the fabrication process of the LED device shown in FIG. 1.

FIG. 4(a) shows the condition in which the LED dies 20 are depressed in position. Recessed portions are formed in the fluorescent sheet 11 due to the depression. The adhesive member 18 pressed between the fluorescent sheet 11 and the sapphire substrate side of each LED die 20 is caused to run over the edges of the LED die 20, thus forming a fillet around the edges.

Figure 4B:
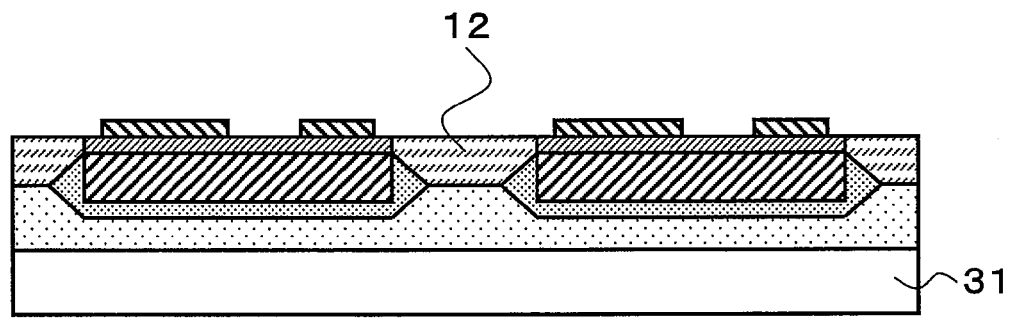

Next, the white reflective layer 12 is formed by molding so as to surround each LED die 20 (see FIG. 4(b)). More specifically, after adjusting the color emission by depressing, a reflective resin is applied around the edges of the LED die 20 by using a dispenser, and then the resin is heated and cured to form the white reflective layer 12. At the same time, the fluorescent layer 11 and the adhesive member 18 are permanently cured. Alternatively, they may be permanently cured in a subsequent step. Further alternatively, the reflective resin may be applied until the device electrodes 13 and 14 are embedded therein, and the white reflective layer 12 may then be formed by polishing until the upper faces of the device electrodes 13 and 14 are exposed. In this case, the electrode-side surface of the LED die 20 is also covered with the white reflective layer 12, which is preferable because this serves to prevent light from leaking through the electrode-side surface.

Figure 4C:
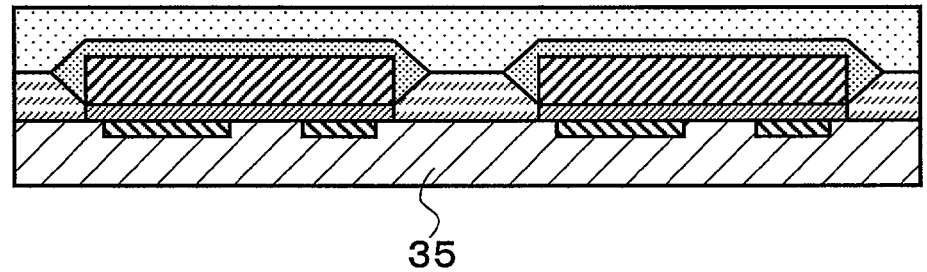

Next, a dicing sheet 35 is attached to the wafer on which the LED dies 20 and the fluorescent sheet 11 have been formed (see FIG. 4(c)). In this step, the wafer is removed from the transparent stage 31, and the dicing sheet 35 is attached to the same side as the device electrodes 13 and 14. The wafer here is shown upside down.

Figure 4D:
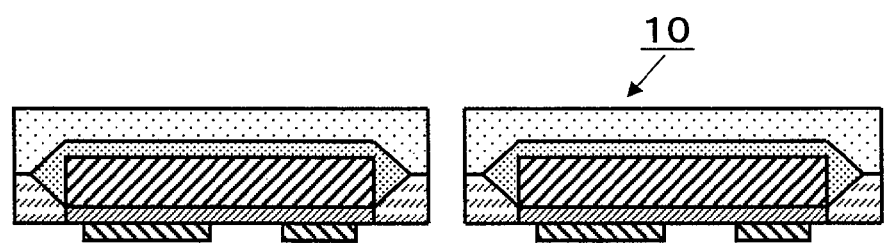

Then, the wafer is diced into individual LED devices 10 (see FIG. 4(d)). That is, individual LED devices 10a are diced from the wafer by a dicer to separate each individual LED device 10, completing the fabrication of the LED device 10. Since the LED device 10 is of a size easy to handle by a surface mounter, the LED device 10 thus separated can be mounted on a surface mount tape carrier. The LED device 10 may be flip-chip mounted on an interposer (intermediate substrate).

FIG. 5 is a diagram for explaining an alternative fabrication process.

The alternative fabrication process shown in FIG. 5 can be used instead of the fabrication process shown in FIG. 3(d) for manufacturing the LED device 10. In the fabrication process shown in FIG. 3(d), the amount of depression has been determined for each individual LED die 20. However, since this method increases the fabrication time, there may arise a problem when manufacturing LED devices in large quantities. By contrast, with the alternative fabrication process shown in FIG. 5, it becomes possible to fabricate LED devices in large quantities in a shorter time.

In the alternative fabrication process of FIG. 5, as in the fabrication process of FIG. 3(d), the LED dies 20 are depressed into the fluorescent substance-containing fluorescent sheet laminated to the transparent stage 31, and the amount of depression is adjusted so as to achieve the desired color emission. However, the alternative fabrication process of FIG. 5 differs from the fabrication process of FIG. 3(d) in the following two points.

The first difference is that a plurality of LED dies 20 having substantially identical emission wavelength distribution characteristics such as peak wavelengths are prepared. Next, in the same manner as the steps shown in FIGS. 3(a) to 3(c), the fluorescent substance-containing fluorescent sheet 11 is laminated to the transparent stage 31, the adhesive member 18 is applied over the portions where the LED dies 20 are to be mounted, and the LED dies 20 are mounted on the fluorescent sheet 11. In this way, the plurality of LED dies 20 are arranged side by side on the fluorescent sheet 11.

The second difference is that pressure is applied simultaneously to the plurality of LED dies 20 to depress them into the fluorescent sheet by using a head 51, such as shown in FIG. 5, that can apply heat as well as pressure. Once the LED dies 20 have been depressed into the fluorescent sheet 11, the LED device 10 can be fabricated in the same manner as the fabrication steps shown in FIGS. 4(a) to 4(d).

When the fluorescent sheet 11 has a uniform thickness and uniform fluorescent substance density, the relationship between the wavelength characteristics of the LED die 20 and the amount of depression of the LED die 20 may be determined in advance and, based on this result, the LED dies 20 may be depressed into the fluorescent sheet 11 in accordance with the alternative fabrication process shown in FIG. 5. On the other hand, when the fluorescent sheet 11 has a varying thickness and/or a varying fluorescent substance density, then after arranging the plurality of LED dies 20 on the fluorescent sheet some of the LED dies 20 are taken as samples, and the amount of depression is measured while adjusting the chromaticity of the emitted light in accordance with the method shown in FIG. 3(d). Then, based on the amount of depression thus measured, all the LED dies 20 may be depressed into the fluorescent sheet 31 by using the head 51. In this way, the desired color emission can be obtained even when the fluorescent substance density, etc. of the fluorescent sheet 11 vary.

In FIG. 5, the head 51 that can simultaneously apply heat and pressure has been used to apply pressure simultaneously to the plurality of LED dies 20. However, the head 51 may be used to only apply pressure, and heat may be applied through the fluorescent sheet 11 by using some other means. In this case, it is preferable to use, instead of the transparent stage 31, a stage formed from a high thermal conductivity material for mounting the fluorescent sheet 11 thereon.

What is claimed is:

1. A method for manufacturing a semiconductor light-emitting element containing an LED die, comprising the steps of:
    arranging said LED die on a fluorescent sheet containing a fluorescent substance; and
    adjusting an amount by which said LED die is depressed into said fluorescent sheet so that said semiconductor light-emitting element has a desired color emission.

2. The method for manufacturing the semiconductor light-emitting element according to claim 1, further comprising the step of preparing a plurality of LED dies having substantially identical emission wavelength distributions, and wherein
    said plurality of LED dies having substantially identical emission wavelength distributions are arranged side by side on said fluorescent sheet, and
    said plurality of LED dies having substantially identical emission wavelength distributions are depressed into said fluorescent sheet by applying pressure simultaneously to said plurality of LED dies by using a head.

3. The method for manufacturing the semiconductor light-emitting element according to claim 2, wherein
    some of said plurality of LED dies are caused to emit light,
    pressure is applied to some of said plurality of LED dies while measuring the color of light emitted from some of said plurality of LED dies caused to emit light,
    the amount of depression is determined so that the color of light emitted from some of said plurality of LED dies caused to emit light matches said desired color emission, and
    other LED dies which are other than some of said plurality of LED dies caused to emit light among said plurality of LED dies are depressed simultaneously into said fluorescent sheet by said determined amount of depression by applying pressure simultaneously to said other LED dies.

4. The method for manufacturing the semiconductor light-emitting element according to claim 3, wherein said head is capable of applying pressure and heat.

5. The method for manufacturing the semiconductor light-emitting element according to claim 2, wherein said head is capable of applying pressure and heat.

6. The method for manufacturing the semiconductor light-emitting element according to claim 1, wherein
    said fluorescent sheet is laminated to a transparent stage,
    said LED die is depressed into said fluorescent sheet while causing said LED die to emit light,
    the color of emitted light is measured through said transparent stage, and
    the amount of depression is determined so that the color of the emitted light matches said desired color emission.

7. The method for manufacturing the semiconductor light-emitting element according to claim 1, further comprising the step of applying an adhesive material between said fluorescent sheet and said LED die before depressing said LED die into said fluorescent sheet.

8. The method for manufacturing the semiconductor light-emitting element according to claim 1, further comprising the step of molding a reflective resin so as to surround said LED die after adjusting said amount of depression.

9. The method for manufacturing the semiconductor light-emitting element according to claim 8, further comprising the steps of:
   after said molding step, cutting said fluorescent sheet together said reflective resin to separate each individual semiconductor light-emitting element; and
   mounting said separated semiconductor light-emitting element on a surface mount carrier tape.

* * * * *